(12) United States Patent
Suzuki et al.

(10) Patent No.: US 8,477,051 B2
(45) Date of Patent: Jul. 2, 2013

(54) VARIABLE-LENGTH CODE DECODING APPARATUS, DECODING SYSTEM, AND VARIABLE-LENGTH CODE DECODING METHOD

(75) Inventors: Kojiro Suzuki, Kawasaki (JP); Masashi Jobashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/424,205

(22) Filed: Mar. 19, 2012

(65) Prior Publication Data
US 2012/0306669 A1   Dec. 6, 2012

(30) Foreign Application Priority Data

May 31, 2011   (JP) ................................. 2011-122278

(51) Int. Cl.
*H03M 7/40* (2006.01)
(52) U.S. Cl.
USPC ......................................................... 341/67
(58) Field of Classification Search
USPC ........... 341/67, 65; 382/170, 232; 375/240.23
See application file for complete search history.

(56) References Cited

U.S. PATENT DOCUMENTS

| 7,541,948 B2 * | 6/2009 | Kadono et al. .................. 341/67 |
| 2008/0225954 A1 | 9/2008 | Suzumura et al. |
| 2008/0227946 A1 | 9/2008 | Kamata et al. |

FOREIGN PATENT DOCUMENTS

| JP | 2007-158698 A2 | 6/2007 |
| JP | 2008-227946 A1 | 9/2008 |

OTHER PUBLICATIONS

T.H. Tsai et al. "A Novel Design of Calvc Decoder with Low Power Consideration", IEEE Asian Solid State Circuits Conference, Nov. 12-14, 2007, Jeju, Korea, pp. 196-199.

* cited by examiner

*Primary Examiner* — Joseph Lauture
(74) *Attorney, Agent, or Firm* — Knobbe Martens Olson & Bear LLP (57) ABSTRACT

A variable-length code decoding apparatus has a first-table storing part to store a first table, a second-table storing part to store a second table, a priority determining part to read out by priority a combination of zero information that is stored in the second table and corresponds a combination of variable-length codes having the largest number of codes, whereas if variable-length codes included in the input bitstream is not stored in the second table but stored in the first table, to read out zero information, and a decoding part to generate the decoded data based on the zero information or the combination of zero information read out by the priority determining part.

20 Claims, 10 Drawing Sheets

FIG. 1

| run | VLC code |
|---|---|
| 0 | 111 |
| 1 | 110 |
| 2 | 101 |
| 3 | 100 |
| 4 | 011 |
| 5 | 010 |
| 6 | 001 |
| 7 | 0001 |
| 8 | 00001 |
| 9 | 000001 |
| 10 | 0000001 |
| 11 | 00000001 |
| 12 | 000000001 |
| 13 | 0000000001 |
| 14 | 00000000001 |

| run | VLC code |
|---|---|
| (0) | 111 |
| (0, 0) | 111111 |
| (0, 1) | 111110 |
| (0, 2) | 111101 |
| (0, 3) | 111100 |
| (0, 4) | 111011 |
| (0, 5) | 111010 |
| (0, 6) | 111001 |
| (0, 7) | 1110001 |
| (0, 8) | 11100001 |
| (0, 9) | 111000001 |
| (0, 10) | 1110000001 |
| (0, 11) | 11100000001 |
| (0, 12) | 111000000001 |
| (0, 13) | 1110000000001 |
| (0, 14) | 11100000000001 |
| (1) | 110 |
| (1, 0) | 110111 |
| (1, 1) | 110110 |
| (1, 2) | 110101 |
| (1, 3) | 110100 |
| (1, 4) | 110011 |
| (1, 5) | 110010 |
| (1, 6) | 110001 |
| (1, 7) | 1100001 |
| (1, 8) | 11000001 |
| (1, 9) | 110000001 |
| (1, 10) | 1100000001 |
| (1, 11) | 11000000001 |
| (1, 12) | 110000000001 |
| (1, 13) | 1100000000001 |
| (2) | 101 |
| (2, 0) | 101111 |
| (2, 1) | 101110 |
| (2, 2) | 101101 |
| (2, 3) | 101100 |
| (2, 4) | 101011 |
| (2, 5) | 101010 |
| (2, 6) | 101001 |
| (2, 7) | 1010001 |
| (2, 8) | 10100001 |
| (2, 9) | 101000001 |
| (2, 10) | 1010000001 |
| (2, 11) | 10100000001 |
| (2, 12) | 101000000001 |

| run | VLC code |
|---|---|
| (3) | 100 |
| (3, 0) | 100111 |
| (3, 1) | 100110 |
| (3, 2) | 100101 |
| (3, 3) | 100100 |
| (3, 4) | 100011 |
| (3, 5) | 100010 |
| (3, 6) | 100001 |
| (3, 7) | 1000001 |
| (3, 8) | 10000001 |
| (3, 9) | 100000001 |
| (3, 10) | 1000000001 |
| (3, 11) | 10000000001 |
| (4) | 011 |
| (4, 0) | 011111 |
| (4, 1) | 011110 |
| (4, 2) | 011101 |
| (4, 3) | 011100 |
| (4, 4) | 011011 |
| (4, 5) | 011010 |
| (4, 6) | 011001 |
| (4, 7) | 0110001 |
| (4, 8) | 01100001 |
| (4, 9) | 011000001 |
| (4, 10) | 0110000001 |
| (5) | 010 |
| (5, 0) | 010111 |
| (5, 1) | 010110 |
| (5, 2) | 010101 |
| (5, 3) | 010100 |
| (5, 4) | 010011 |
| (5, 5) | 010010 |
| (5, 6) | 010001 |
| (5, 7) | 0100001 |
| (5, 8) | 01000001 |
| (5, 9) | 010000001 |
| (6) | 001 |
| (6, 0) | 001111 |
| (6, 1) | 001110 |
| (6, 2) | 001101 |
| (6, 3) | 001100 |
| (6, 4) | 001011 |
| (6, 5) | 001010 |
| (6, 6) | 001001 |
| (6, 7) | 0010001 |

| run | VLC code |
|---|---|
| (6, 8) | 00100001 |
| (7) | 0001 |
| (7, 0) | 0001111 |
| (7, 1) | 0001110 |
| (7, 2) | 0001101 |
| (7, 3) | 0001100 |
| (7, 4) | 0001011 |
| (7, 5) | 0001010 |
| (7, 6) | 0001001 |
| (7, 7) | 00010001 |
| (8) | 00001 |
| (8, 0) | 00001111 |
| (8, 1) | 00001110 |
| (8, 2) | 00001101 |
| (8, 3) | 00001100 |
| (8, 4) | 00001011 |
| (8, 5) | 00001010 |
| (8, 6) | 00001001 |
| (9) | 000001 |
| (9, 0) | 000001111 |
| (9, 1) | 000001110 |
| (9, 2) | 000001101 |
| (9, 3) | 000001100 |
| (9, 4) | 000001011 |
| (9, 5) | 000001010 |
| (10) | 0000001 |
| (10, 0) | 0000001111 |
| (10, 1) | 0000001110 |
| (10, 2) | 0000001101 |
| (10, 3) | 0000001100 |
| (10, 4) | 0000001011 |
| (11) | 00000001 |
| (11, 0) | 00000001111 |
| (11, 1) | 00000001110 |
| (11, 2) | 00000001101 |
| (11, 3) | 00000001100 |
| (12) | 000000001 |
| (12, 0) | 000000001111 |
| (12, 1) | 000000001110 |
| (12, 2) | 000000001101 |
| (13) | 0000000001 |
| (13, 0) | 0000000001111 |
| (13, 1) | 0000000001110 |
| (14) | 00000000001 |
| (14, 0) | 00000000001111 |

FIG. 5

|  | SINGLE CODE TABLE | JP-A2007-158698 (KOKAI) | JP-A2008-227946 (KOKAI) | FIRST EXAMPLE |
|---|---|---|---|---|
| OPERATING FREQUENCY | 1.0 | 0.5 | 1.0 | 1.0 |
| 4X4 DECODING CYCLE | 16 | 8 | 11 | 8 |
| NUMBER OF CODE WORDS | 15 | 30 | 22 | 135 |
| TOTAL ENCODED BIT NUMBER | 81 | 162 | 186 | 1041 |

| run | VLC code |
|---|---|
| (0) | 111 |
| (0, 0) | 111111 |
| (0, 0, 0) | 111111111 |
| (0, 0, 0, 0) | 111111111111 |
| (0, 0, 0, 1) | 111111111110 |
| (0, 0, 0, 2) | 111111111101 |
| (0, 0, 0, 3) | 111111111100 |
| (0, 0, 0, 4) | 111111111011 |
| (0, 0, 0, 5) | 111111111010 |
| (0, 0, 0, 6) | 111111111001 |
| (0, 0, 0, 7) | 1111111110001 |
| (0, 0, 0, 8) | 11111111100001 |
| (0, 0, 0, 9) | 111111111000001 |
| (0, 0, 0, 10) | 1111111110000001 |
| (0, 0, 0, 11) | 11111111100000001 |
| (0, 0, 0, 12) | 111111111000000001 |
| (0, 0, 1) | 111111110 |
| (0, 0, 2) | 111111101 |
| (0, 0, 3) | 111111100 |
| (0, 0, 4) | 111111011 |
| (0, 0, 5) | 111111010 |
| (0, 0, 6) | 111111001 |
| (0, 0, 7) | 1111110001 |
| (0, 0, 8) | 11111100001 |
| (0, 0, 9) | 111111000001 |
| (0, 0, 10) | 1111110000001 |
| (0, 0, 11) | 11111100000001 |
| (0, 0, 12) | 111111000000001 |
| (0, 0, 13) | 1111110000000001 |
| (0, 1) | 111110 |
| (0, 1, 0) | 111110111 |
| (0, 1, 1) | 111110110 |
| (0, 1, 2) | 111110101 |
| (0, 1, 3) | 111110100 |
| (0, 1, 4) | 111110011 |
| (0, 1, 5) | 111110010 |
| (0, 1, 6) | 111110001 |

| run | VLC code |
|---|---|
| (0, 1, 7) | 1111100001 |
| (0, 1, 8) | 11111000001 |
| (0, 1, 9) | 111110000001 |
| (0, 1, 10) | 1111100000001 |
| (0, 1, 11) | 11111000000001 |
| (0, 1, 12) | 111110000000001 |
| (0, 2) | 111101 |
| (0, 3) | 111100 |
| (0, 4) | 111011 |
| (0, 5) | 111010 |
| (0, 6) | 111001 |
| (0, 7) | 1110001 |
| (0, 8) | 11100001 |
| (0, 9) | 111000001 |
| (0, 10) | 1110000001 |
| (0, 11) | 11100000001 |
| (0, 12) | 111000000001 |
| (0, 13) | 1110000000001 |
| (0, 14) | 11100000000001 |
| (1) | 110 |
| (1, 0) | 110111 |
| (1, 0, 0) | 110111111 |
| (1, 0, 1) | 110111110 |
| (1, 0, 2) | 110111101 |
| (1, 0, 3) | 110111100 |
| (1, 0, 4) | 110111011 |
| (1, 0, 5) | 110111010 |
| (1, 0, 6) | 110111001 |
| (1, 0, 7) | 1101110001 |
| (1, 0, 8) | 11011100001 |
| (1, 0, 9) | 110111000001 |
| (1, 0, 10) | 1101110000001 |
| (1, 0, 11) | 11011100000001 |
| (1, 0, 12) | 110111000000001 |
| (1, 1) | 110110 |
| (1, 2) | 110101 |
| (1, 3) | 110100 |

| run | VLC code |
|---|---|
| (1, 4) | 110011 |
| (1, 5) | 110010 |
| (1, 6) | 110001 |
| (1, 7) | 1100001 |
| (1, 8) | 11000001 |
| (1, 9) | 110000001 |
| (1, 10) | 1100000001 |
| (1, 11) | 11000000001 |
| (1, 12) | 110000000001 |
| (1, 13) | 1100000000001 |
| (2) | 101 |
| (2, 0) | 101111 |
| (2, 1) | 101110 |
| (2, 2) | 101101 |
| (2, 3) | 101100 |
| (2, 4) | 101011 |
| (2, 5) | 101010 |
| (2, 6) | 101001 |
| (2, 7) | 1010001 |
| (2, 8) | 10100001 |
| (2, 9) | 101000001 |
| (2, 10) | 1010000001 |
| (2, 11) | 10100000001 |
| (2, 12) | 101000000001 |
| (3) | 100 |
| (4) | 011 |
| (5) | 010 |
| (6) | 001 |
| (7) | 0001 |
| (8) | 00001 |
| (9) | 000001 |
| (10) | 0000001 |
| (11) | 00000001 |
| (12) | 000000001 |
| (13) | 0000000001 |
| (14) | 00000000001 |

FIG. 8

|  | JP-A2008-227946 (KOKAI) | FIRST EXAMPLE | SECOND EXAMPLE |
|---|---|---|---|
| OPERATING FREQUENCY | 1.0 | 1.0 | 1.0 |
| 4X4 DECODING CYCLE | 11 | 8 | 4 |
| NUMBER OF CODE WORDS | 22 | 135 | 110 |
| TOTAL ENCODED BIT NUMBER | 186 | 1041 | 1025 |

FIG. 9

| run | VLC code |
|---|---|
| (0) | 111 |
| (0, 0) | 111111 |
| (0, 0, 0) | 111111111 |
| (0, 0, 0, 0) | 111111111111 |
| (0, 0, 0, 1) | 111111111110 |
| (0, 0, 0, 2) | 111111111101 |
| (0, 0, 0, 3) | 111111111100 |
| (0, 0, 1) | 111111110 |
| (0, 0, 2) | 111111101 |
| (0, 0, 3) | 111111100 |
| (0, 0, 4) | 111111011 |
| (0, 1) | 111110 |
| (0, 1, 0) | 111110111 |
| (0, 1, 1) | 111110110 |
| (0, 1, 2) | 111110101 |
| (0, 1, 3) | 111110100 |

| run | VLC code |
|---|---|
| (0, 2) | 111101 |
| (0, 3) | 111100 |
| (0, 4) | 111011 |
| (0, 5) | 111010 |
| (1) | 110 |
| (1, 0) | 110111 |
| (1, 0, 0) | 110111111 |
| (1, 0, 1) | 110111110 |
| (1, 0, 2) | 110111101 |
| (1, 0, 3) | 110111100 |
| (1, 1) | 110110 |
| (1, 2) | 110101 |
| (1, 3) | 110100 |
| (1, 4) | 110011 |
| (2) | 101 |
| (2, 0) | 101111 |

| run | VLC code |
|---|---|
| (2, 1) | 101110 |
| (2, 2) | 101101 |
| (2, 3) | 101100 |
| (3) | 100 |
| (4) | 011 |
| (5) | 010 |
| (6) | 001 |
| (7) | 0001 |
| (8) | 00001 |
| (9) | 000001 |
| (10) | 0000001 |
| (11) | 00000001 |
| (12) | 000000001 |
| (13) | 0000000001 |
| (14) | 00000000001 |

| | JP-A2008-227946 (KOKAI) | FIRST EXAMPLE | SECOND EXAMPLE | THIRD EXAMPLE |
|---|---|---|---|---|
| OPERATING FREQUENCY | 1.0 | 1.0 | 1.0 | 1.0 |
| 4X4 DECODING CYCLE | 11 | 8 | 4 | 4 |
| NUMBER OF CODE WORDS | 22 | 135 | 110 | 47 |
| TOTAL ENCODED BIT NUMBER | 186 | 1041 | 1025 | 336 |

FIG. 12

| run | VLC code |
|---|---|
| 0 | 111 |
| 1 | 110 |
| 2 | 101 |
| 3 | 100 |
| 4 | 011 |
| 5 | 010 |
| 6 | 001 |
| 7 | 0001 |
| 8 | 00001 |
| 9 | 000001 |
| 10 | 0000001 |
| 11 | 00000001 |
| 12 | 000000001 |
| 13 | 0000000001 |
| 14 | 00000000001 |
| (0, 0) | 111111 |
| (0, 1) | 111110 |

FIG. 13

| | H.254 STANDARDS (SINGLE CODE) | JP-A2008-227946 (KOKAI) | FOURTH EXAMPLE |
|---|---|---|---|
| OPERATING FREQUENCY | 1.0 | 1.0 | 1.0 |
| 4X4 DECODING CYCLE | 16 | 11 | 8 |
| NUMBER OF CODE WORDS | 15 | 22 | 17 |
| TOTAL ENCODED BIT NUMBER | 81 | 186 | 93 |

FIG. 14

VARIABLE-LENGTH CODE DECODING APPARATUS, DECODING SYSTEM, AND VARIABLE-LENGTH CODE DECODING METHOD

CROSS REFERENCE TO RELATED APPLICATIONS

This application is based upon and claims the benefit of priority from the prior Japanese Patent Application No. 2011-122278, filed on May 31, 2011, the entire contents of which are incorporated herein by reference.

FIELD

Embodiments relate to a variable-length code decoding apparatus, a decoding system, and a variable-length code decoding method for decoding variable-length codes.

BACKGROUND

Video compression and decompression standards, such as H.264, VC-1, MPEG-4, MPEG-2, and JPEG, use variable-length codes, hence require a variable-length code decoding apparatus in a decoding system. However, a variable-length code decoding process has a difficulty in decoding a plurality of variable-length codes in parallel, which tends to be a bottleneck in a processing performance of a decoding system.

In general, for an image of standard definition (SD), it is enough to decode one symbol for each clock cycle. However, as a display resolution becomes higher from high definition (HD) to super high vision, a higher decoding efficiency is required, hence there is a demand for improving the processing performance so that a plurality of variable-length codes per clock cycle can be decoded.

There are proposals for decoding a plurality of variable-length codes within the same clock cycle (referring to patent documents 1 and 2). However, there are problems in the proposals, such as the difficulty in increase in operating frequency and the dependency of decoding performance on the appearance pattern of variable-length codes.

DETAILED DESCRIPTION

Embodiments will now be explained with reference to the accompanying drawings.

A variable-length code decoding apparatus decodes an input bitstream composed of a plurality of variable-length codes into decoded data composed of nonzeros and zero information expressing a number of successive zeros of 0 or more piece.

The variable-length code decoding apparatus has a first-table storing part configured to store a first table that associates each of the variable-length codes with zero information of a corresponding decoded data, a second-table storing part configured to store a second table that associates combinations of a plurality of types of variable-length codes with combinations of zero information of a plurality of types of decoded data, a priority determining part configured, if variable-length codes included in the input bitstream and a combination of the variable-length codes are stored in both of the first and second tables, to read out by priority a combination of zero information that is stored in the second table and corresponds a combination of variable-length codes having the largest number of codes, whereas if variable-length codes included in the input bitstream is not stored in the second table but stored in the first table, to read out zero information that is stored in the first table and corresponds to the variable-length codes, and a decoding part configured to generate the decoded data based on the zero information or the combination of zero information read out by the priority determining part, for each group of a plurality of types of variable-length codes included in the input bitstream.

Figure 1:
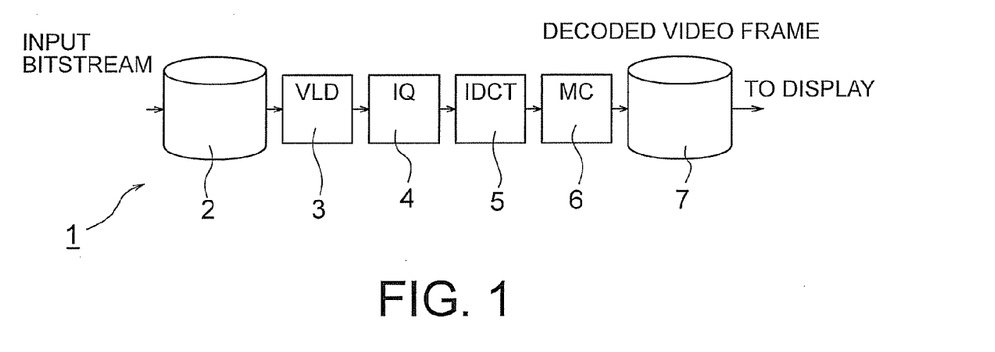
FIG. 1 is a block diagram schematically showing the configuration of a decoding system according to an embodiment.

FIG. 1 is a block diagram schematically showing the configuration of a decoding system according to an embodiment. The decoding system 1 of FIG. 1 has a FIFO apparatus 2 that temporarily stores an input bitstream, a VLD (Variable Length code Decoding) apparatus 3, an IQ (Inverse Quantization) apparatus 4, an IDCT (Inverse Discrete Cosine Transform) apparatus 5, an MC (Motion Compensation) apparatus 6, and a frame memory 7.

The VLD apparatus 3 decodes variable-length codes included in an input bitstream to convert them into DCT (Discrete Cosine Transform) coefficients, for example. The IQ apparatus 4 inverse-quantizes the DCT coefficients. The IDCT apparatus 5 performs inverse discrete cosine transform to the data after inverse quantization to convert frequency-converted information into pixel information. The MC apparatus 6 performs motion compensation to the data after inverse discrete cosine transform to generate decoded data. The generated decoded data is stored in the frame memory 7.

In the following, the internal configuration and the operation of the VLD apparatus 3 will be mainly explained.

An input bitstream includes a plurality of variable-length codes. In variable-length codes, a code word of higher frequency of appearance has a shorter code length. The input bitstream is obtained by encoding at an encoding apparatus (not shown). Explained below as an example is an input bitstream encoded in H.264 standards. An H.264 input bitstream is obtained by encoding original video data with motion compensation, DCT (Discrete Cosine Transform) and quantization.

The DCT converts pixel signals of original video data into frequency components to reduce redundant information in a video frame. The DCT generates DCT coefficients. A DCT coefficient is composed of a nonzero or zeros, the number of the zeros being 0 or more. "The number of successive zeros before a nonzero" is referred to as run. It is referred to as run_before in H.264. It is simply referred to as run in MPEG-2, MPEG-4, JPEG, etc. However, there is no particular difference between run_before and run, hence the term "run" is used hereinbelow with no distinction.

Figure 2:
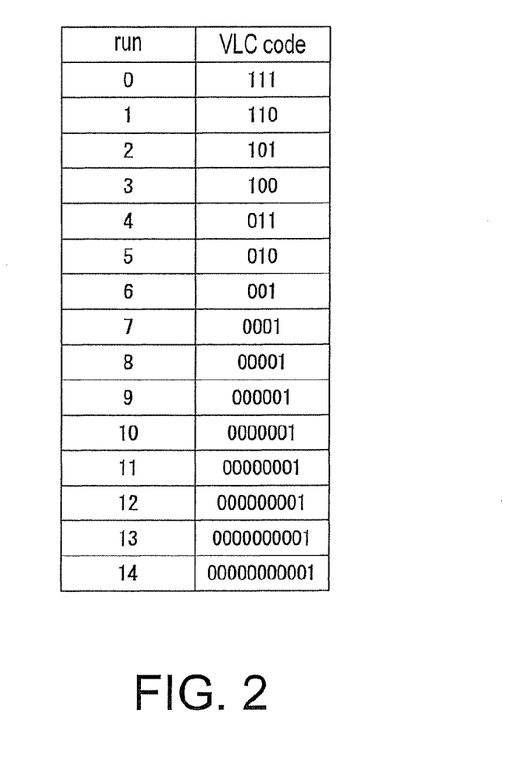
FIG. 2 is a view showing an example of a table that is a list of runs and the corresponding variable-length codes in H.264.

A DCT coefficient is converted into a variable-length code. FIG. 2 is a view showing an example of a table that is a list of runs and the corresponding variable-length codes in H.264. A code of higher degree of appearance has a shorter code length. The code length becomes longer as the number of runs becomes larger.

Figure 3:
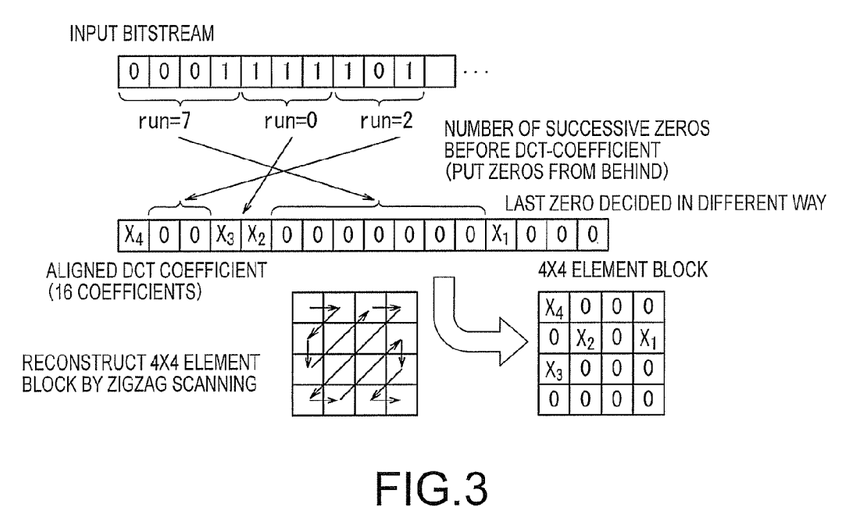
FIG. 3 is a view explaining a variable-length code decoding process for converting variable-length codes encoded based on the table of FIG. 2 into original DCT coefficients.

FIG. 3 is a view explaining a variable-length code decoding process for converting variable-length codes encoded based on the table of FIG. 2 into original DCT coefficients. Each variable-length code is obtained by encoding DCT coefficients each composed of a nonzero or zeros, the number of the zeros being 0 or more. In the example of FIG. 3, an input bitstream includes a variable-length code "00001" with run=7, a variable-length code "111" with run=0, and a variable-length code "101" with run=2.

In the variable-length code decoding process, variable-length codes included in an input bitstream are decoded one by one in the reverse order of transmission. In the example of FIG. 3, the variable-length code "101" with run=2 is decoded first and thus be converted into DCT coefficients, three in total, composed of a nonzero X4 and zeros "00", then the variable-length code "111" with run=0 is decoded and thus be converted into a DCT coefficient, one in total, composed of a nonzero X3, and then the variable-length code "00001" with run=7 is decoded and thus be converted into DCT coefficients of eight pieces in total composed of a nonzero X2 and zeros "0000000".

These DCT coefficients are, as shown in FIG. 3, arranged in a 4×4 element block in a zigzag pattern. A DCT coefficient is a resultant of decomposing an original image into low and high frequency components. By arranging DCT coefficients in a zigzag pattern in a block, DCT coefficients of low frequency components that significantly affect image quality can concentrate on a portion of a block.

Thereafter, the IQ apparatus 4, the IDCT apparatus 5, and the MC apparatus 6 perform inverse quantization, inverse discrete cosine transform, and motion compensation, respectively, to the DCT coefficients for each block, thus reconstructing original video data. The reconstructed video data is stored in the frame memory 7.

Figure 4:
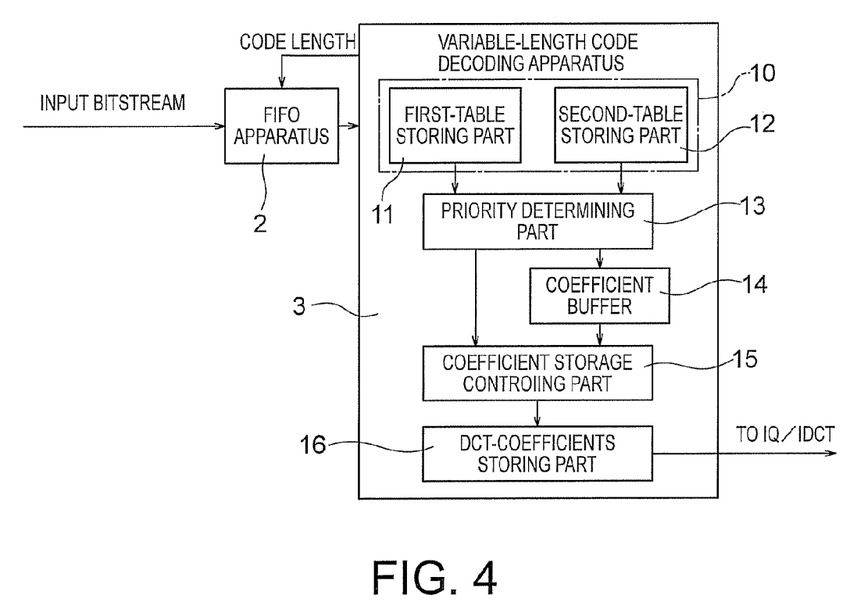
FIG. 4 is a view showing an example of the internal configuration of a VLD apparatus 3.

FIG. 4 is a view showing an example of the internal configuration of the VLD apparatus 3. The VLD apparatus 3 of FIG. 4 has a first-table storing part 11, a second-table storing part 12, a priority determining part 13, a coefficient buffer 14, a coefficient storage controlling (decoding) part 15, and a DCT-coefficients storing part 16. Explained hereinbelow is a composite table storing part 10 that is the integration of the first- and second-table storing parts 11 and 12.

The first-table storing part 11 stores a first table that is a list of variable-length codes and the corresponding zero information of DCT coefficients. The second-table storing part 12 stores a second table that associates combinations of a plurality of types of variable-length codes with combinations of zero information of a plurality of types of DCT coefficients. Concrete examples of the first and second tables will be described later. In this example, a composite table of the first and second tables integrated to each other is stored in the composite table storing part 10.

The priority determining part 13 determines whether zero information stored in the first table in the composite table or a combination of zero information stored in the second table is read out.

In more detail, if variable-length codes included in an input bitstream and a combination of the variable-length codes are stored in both of the first and second tables, the priority determining part 13 reads out by priority a combination of zero information that is stored in the second table and corresponds to the combination of variable-length codes having the largest number of codes. On the other hand, if variable-length codes included in the input bitstream and a combination of the variable-length codes is not stored in the second table but stored in the first table, the priority determining part 13 reads out zero information that is not stored in the first table and corresponds to the variable-length codes.

When the priority determining part 13 reads out by priority a combination of zero information stored in the second table, the coefficient buffer 14 acquires the nonzero corresponding to the combination from the input bitstream and temporarily stores it. The input bitstream includes nonzeros corresponding to respective variable-length codes. The coefficient buffer 14 acquires nonzeros from the input bitstream and temporarily stores them according to need In variable-length codes, there are nonzeros corresponding to respective zero information. Therefore, when the priority determining part 13 reads out a combination of zero information, it means that there is a plurality of types of nonzeros. Accordingly, the reason for providing the coefficient buffer 14 is that it is required to temporarily store the nonzeros until all of the nonzeros are written.

The coefficient storage controlling part 15 performs a sequence of generating DCT coefficients according to the steps shown in FIG. 3 based on the zero information or the combination of zero information read out by the priority determining part 13 for each group of a plurality of types of variable-length codes (for example, 4×4 variable-length codes) included in the input bitstream. The generated DCT coefficients are stored in the DCT-coefficients storing part 16.

Various kinds of tables can be assumed as concrete examples for the second table. Hereinbelow, four types of the second table will be explained as examples. Each table which will be explained below is a composite table of a first table and a second table combined with each other, for convenience. First tables are identical to one another but second tables are different from one other in the examples of combine tables.

FIRST EXAMPLE OF COMPOSITE TABLE

Figure 5:
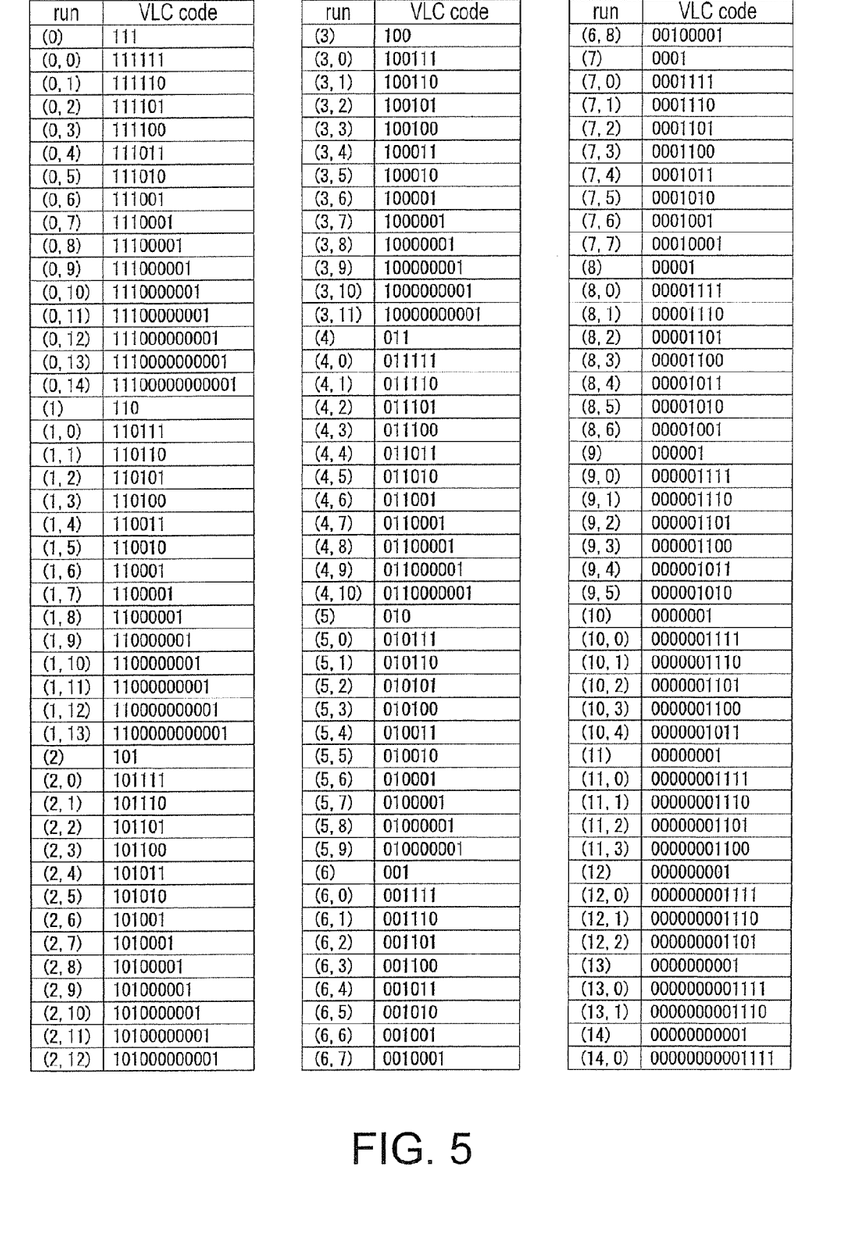
FIG. 5 is a view showing a composite table according to a first example.

FIG. 5 is a view showing a composite table according to a first example. The second table in the composite table of FIG. 5 is the list of combinations of two variable-length codes and the corresponding combinations of zero information. In FIG. 5, a variable-length code and the corresponding zero information are denoted as a VLC code and run, respectively. For example, run (0) denotes 0 for the number of zeros exited between successive two nonzeros. For example, run (0, 0) denotes that no zeros exist between each pair of two successive nonzeros among three successive nonzeros. This means, from a different point of view, that there are three nonzeros successively aligned having no zeros thereamong. Moreover, run (1, 13) denotes, among successive three nonzeros, 1 for the number of zeros existed between the former successive two nonzeros and 13 for the number of zeros existed between the latter successive two nonzeros. Accordingly, each run in FIG. 5 expresses the number of zeros existed between two or among three successive nonzeros.

The composite table of FIG. 5 corresponds to a decoding process to obtain DCT coefficients for a 4×4 element block. There are 16 elements to be processed at a time in one block. Put in each element is a nonzero or a zero of a DCT coefficient. It is a characteristic of the composite table of FIG. 5 that a combination of maximum two variable-length codes can be converted into a combination of zero information.

A requirement for forming the composite table of FIG. 5 is that the total number of nonzeros and zeros does not exceed 16 which is the total number of elements in one block. Only the data that meets the requirement is registered. Accordingly, the number of zeros existed between at least two nonzeros never exceed 14. In the composite table of FIG. 5, the variable-length codes for which the total number of runs exceeds 14 are not listed to reduce the number of entries.

The composite table of FIG. 5 includes the first table that shows zero information corresponding to one variable-length code and the second table that shows zero information corresponding to the combination of two variable-length codes. For example, when an input bitstream includes an odd number of variable-length codes, the decoding process is performed to each pair of variable-length codes from the header portion of the input bitstream while looking-up the composite table of FIG. 5. Therefore, one variable-length code remains at the end portion of the input bitstream. The zero information corresponding to the last variable-length code cannot be found in the second table. Accordingly, the first table is also included in the composite table.

Figure 6:
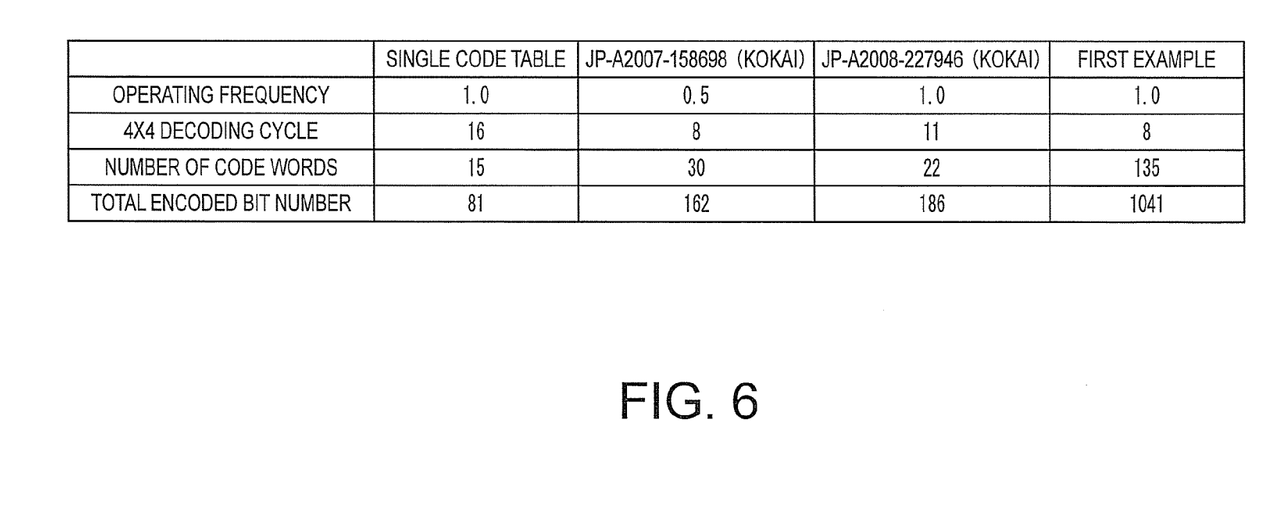
FIG. 6 is a view for comparing the performance of a decoding process between the case where the composite table of FIG. 5 is used and the case where a known table is used.

FIG. 6 is a view for comparing the performance of a decoding process between the case where the composite table of FIG. 5 is used and the other case where known tables are used. Compared in FIG. 6 is the performance of a decoding process among the case of using a single code table listing a plurality of zero information and the corresponding variable-length codes, the case of using a table disclosed in Japanese Patent Application Laid-Open Publication No. 2007-158698, and the case of using a table disclosed in Japanese Patent Application Laid-Open Publication No. 2008-227946. FIG. 6 shows the performance of each table only, with no other performances considered.

In the conventional table, the number of processing cycles is increased to 11 when variable-length codes have a specific bit pattern (for example, a pattern of 0 and 1 appearing alternately). By contrast, in the composite table of FIG. 5, the decoding process can always be performed with eight processing cycles irrespective of the bit pattern of variable-length codes.

Nevertheless, the composite table of FIG. 5 has a large number of entries, hence inevitably has a large data capacity. Therefore, implementation of this composite table into a semiconductor device requires a large occupation area on a substrate. For this reason, the capacity of the composite table is reduced in second to fourth examples of composite table, which will be explained later.

Before explaining the composite table according to the second to fourth examples, the steps of decoding process to obtain DCT coefficients using any one of the composite tables of these examples will be explained in detail with reference to FIG. 7.

Figure 7:
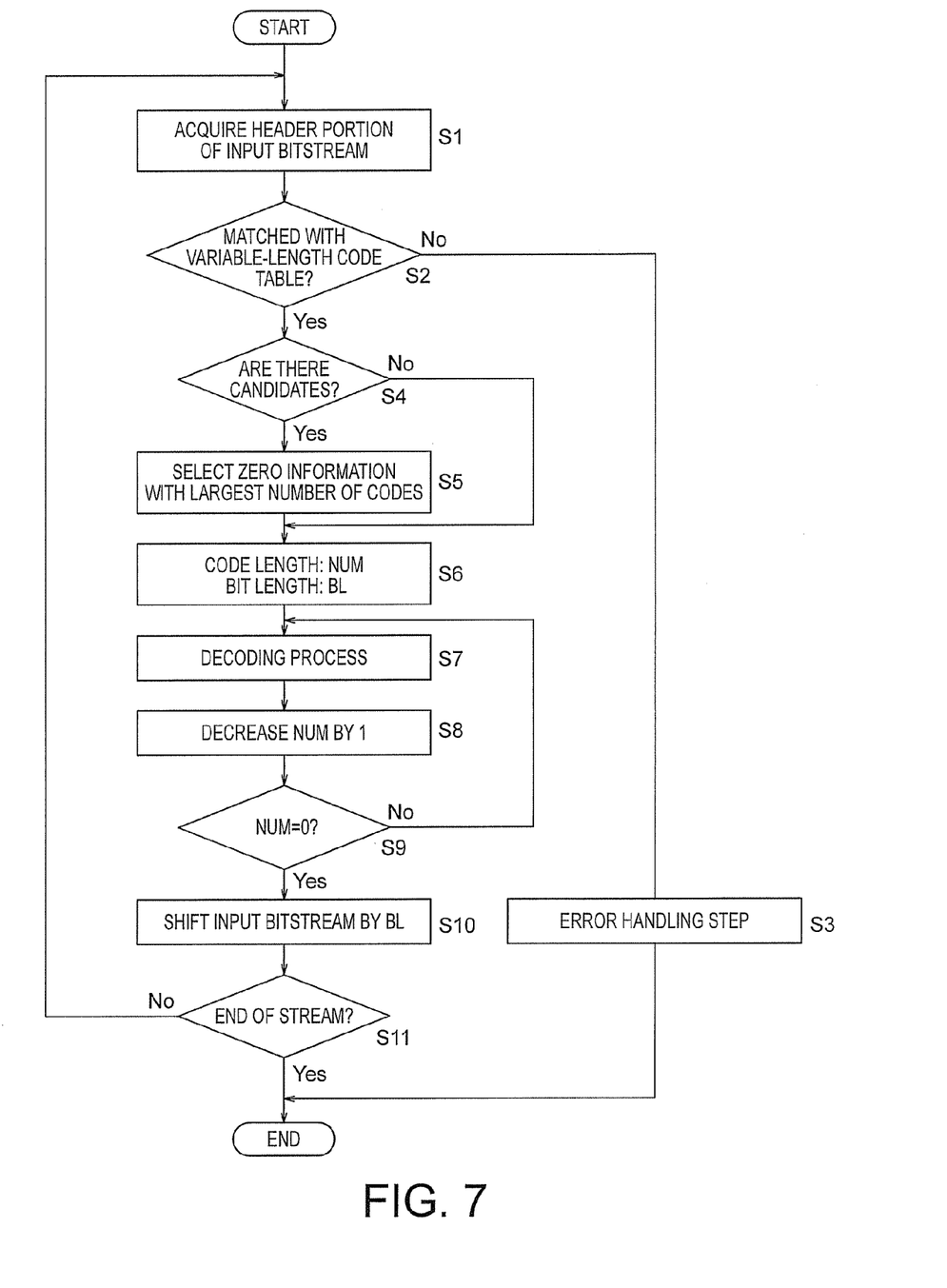
FIG. 7 is a flowchart of the steps of a decoding process performed by a VLD apparatus 3 according to an embodiment.

FIG. 7 is a flowchart of a decoding process performed by the VLD apparatus 8 according to an embodiment. Firstly, the header portion of an input bitstream is acquired (S1). When the composite table of FIG. 5 is used, the VLD apparatus 8 acquires a certain number of bits enough to simultaneously acquire maximum two variable-length codes, so that the remaining amount of the input bitstream becomes the upper limit. The upper limit of the number of bits to be acquired depends on a composite table to be used.

Next, the VLD apparatus 8 searches whether the acquired variable-length codes or their combination exists in the composite table (S2). Here, the VLD apparatus 8 searches whether a bit string included in the header portion of the input bitstream matches any variable-length code in the composite table. The matched variable-length code is then extracted as a candidate. This extraction operation is performed for the entire composite table. In the composite table, stored in the first table is one variable-length code whereas stored in the second table is the combination of maximum two variable-length codes. Therefore, a plurality of variable-length codes or their combinations that match the bit string included in the header portion of the input bitstream may be found. If the acquired variable-length codes or their combinations do not exist in the composite table, an error handling step is performed (S3).

If the acquired variable-length codes exist or their combination exists in the composite table (S2, YES), it is determined whether there are a plurality of candidates in the composite table (S4). If there are a plurality of candidates, zero information of the combination of variable-length codes having the largest number of codes is selected (S5).

In the case of the composite table of FIG. 5, the zero information matched with the combination of two variable-length codes acquired from the input bitstream is read out from the second table. If there are an odd number of variable-length codes in the input bitstream, that is, if one variable-length code only is acquired, zero information is read out from the first table.

If step S5 described above is completed or it is determined in step S4 described above that a plurality of candidates do not exist, the number of words of acquired variable-length codes (or their combination) is set to a variable NUM and the total bit length is set to a variable BL (S6). Next, the decoding process for obtaining DCT coefficients is performed for the acquired variable-length codes (or their combination) (S7).

For example, if a bit string "111010" is included in the header portion of the input bitstream, (0, 5) is extracted from the composite table of FIG. 5, with the decoding process being performed to obtain one DCT coefficient composed of a nonzero with no zeros, five DCT coefficients composed of zeros, and one DCT coefficient composed of a nonzero.

When a decoding process for one variable-length code is completed, the variable NUM is deceased by one (S8). Next, it is determined whether the variable NUM becomes zero (S9). If not zero, step S7 and the succeeding steps are repeated. If the variable NUM becomes zero, the header portion of the input bitstream is shifted by the bit length indicated by the variable BL (S10). It is determined whether, as a result of shifting, the header portion has reached the end portion of the input bitstream (S11). If not reached the end portion of the input bitstream, the process returns to 51 whereas, if reached, the process is completed.

As described above, the composite table according to the first example allows simultaneous decoding of maximum two variable-length codes in the input bitstream, thus enhancing the decoding performance irrespective of the bit pattern of variable-length codes. Moreover, only necessary variable-length codes are registered in the composite table of the first example based on a block to be processed at a time. Therefore, it is possible to reduce the number of variable-length codes to be registered in the composite table.

SECOND EXAMPLE OF COMPOSITE TABLE

Figure 8:
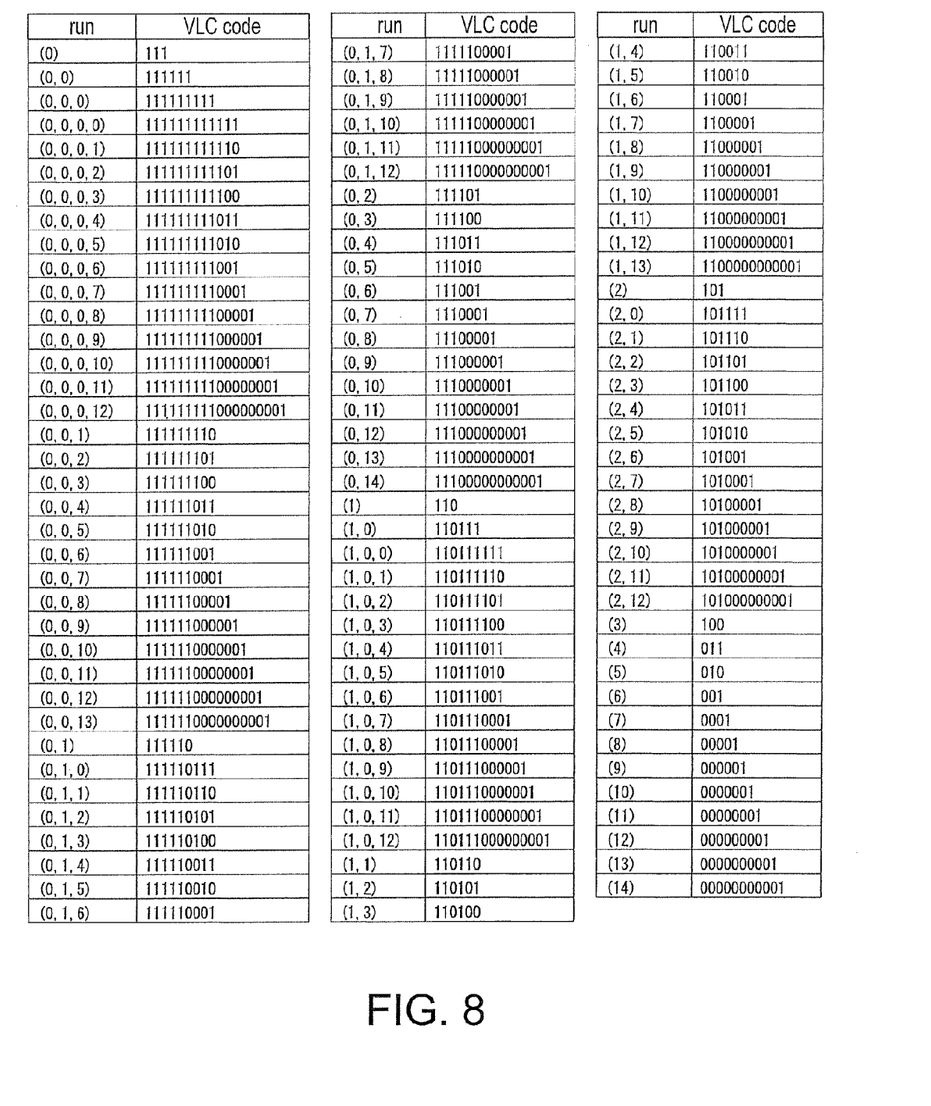
FIG. 8 is a view showing a composite table according to a second example.

FIG. 8 is a view showing a composite table according to a second example. The composite table of FIG. 8 includes the first table and a second table showing the combinations of maximum four variable-length codes and zero information corresponding to the combinations. Only the data that satisfy the following requirements 1 and 2 are registered in the second table of the composite table of FIG. 8 in order to avoid the increase in data amount. The requirement 1 is the same as that for the composite table of the first example. It is assumed for both of the requirements 1 and 2 that 4×4 elements are processed per block.

1: The total of runs (the total number of zeros) does not exceed 16.

2: If the total number of nonzeros and zeros corresponding to a combination of variable-length codes becomes four or more, another variable-length code is not included in the combination.

The requirement 2 is provided for the strategy to complete a 1-block decoding process within four clock cycles. In order to complete the strategy, the total number of nonzeros and zeros is increased to four or more within one clock cycle. Conversely, if the total number described above becomes four or more in one clock cycle, the total number is not increased any further.

According to this point of view, in the requirement 2, the number of combinations of variable-length codes is increased until the total number of nonzeros and zeros becomes four and another variable-length code is not included in the combinations any more, thus reducing the number of combinations of variable-length codes.

In the case of the composite table of FIG. 8, a 4×4 element block can be decoded for four clock cycles irrespective of the bit pattern of variable-length codes in an input bitstream.

Figure 9:
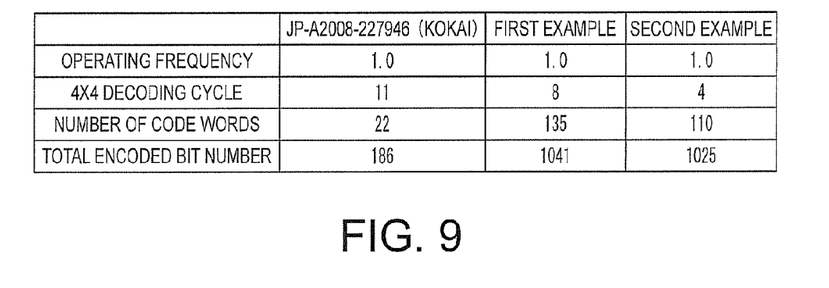
FIG. 9 is a view for comparing the performance of a decoding process between the case where the composite table of FIG. 8 is used and the case where the composite table of FIG. 5 or a known table is used.

FIG. 9 is a view for comparing the performance of a decoding process between the case where the composite table of the second example is used and the case where the composite table of the first example or a known table is used. In the composite table of the second example, the number of codes and the total number of code bits are more decreased than the composite table of the first example, hence the occupation area on a semiconductor being also reduced. Moreover, even though the number of codes and the total number of code bits are decreased, the clock cycles needed for the decoding process in the composite table of the second example is reduced to half of the composite table of the first example, thus achieving a higher decoding speed.

As described above, the composite table of the second example allows simultaneous decoding of maximum four variable-length codes, thus achieving higher decoding performance than the composite table of the first example. Moreover, the data amount can be restricted in the composite table of the second example as far as decoding of a 4×4 element block at four clock cycles is possible, thus achieving compactness.

THIRD EXAMPLE OF COMPOSITE TABLE

Figure 10:
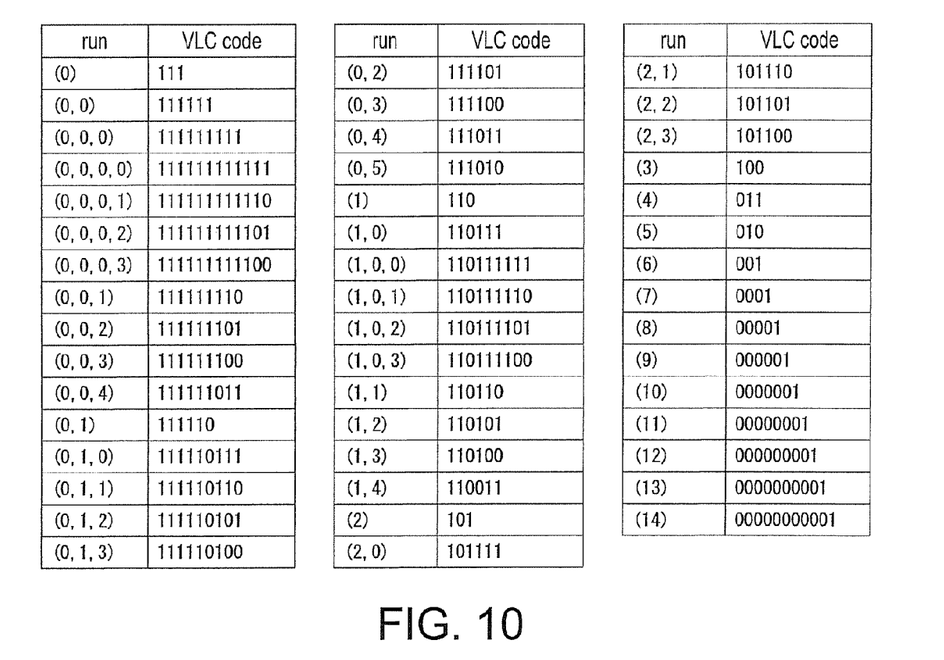
FIG. 10 is a view showing a composite table according to a third example.

FIG. 10 is a view showing a composite table according to a third example. The composite table of FIG. 10 includes the first table and, like the composite table of FIG. 8, a second table showing the combinations of maximum four variable-length codes and zero information corresponding to the combinations. Registered in the composite table of FIG. 10 are the data that satisfy the following requirement 3, in addition to the requirements 1 and 2.

3: The total number of nonzeros and zeros is smaller than eight.

Figure 11:
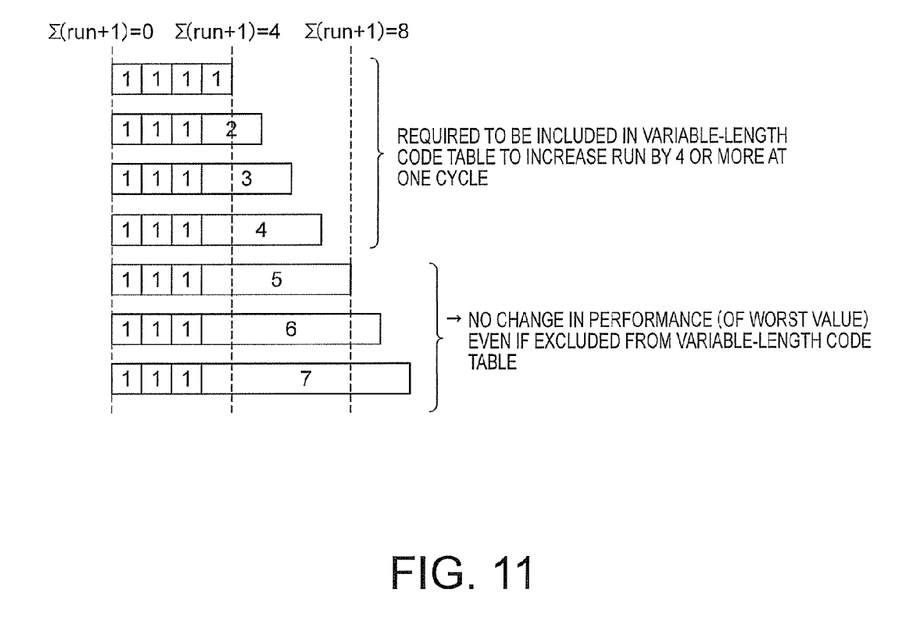
FIG. 11 is a view for explaining a requirement 3.

FIG. 11 is a view for explaining the requirement 3. FIG. 11 shows an example of DCT coefficients in which three successive nonzeros from the header portion are followed by zeros towards the last DCT coefficient, and the number of the zeros is changed among the DCT coefficients. The zeros that follow the nonzeros are included in the composite table if the number of the zeros is in the range from 1 to 4, in order to satisfy the requirement 2. On the other hand, when the number of the zeros that follow the nonzeros is five or more, even if the variable-length code corresponding to the zeros is decoded at the next clock cycle, run can be proceeded by four on average for one clock cycle. Therefore, even if these five or more of zeros are excluded from the composite table, decoding performance is not deteriorated. Accordingly, in the requirement 3, five or more of zeros that follow nonzeros are excluded from the composite table. By providing the requirement 3, it is possible to reduce the number of entries, compared to the case of using the composite table of FIG. 8.

Figure 12:
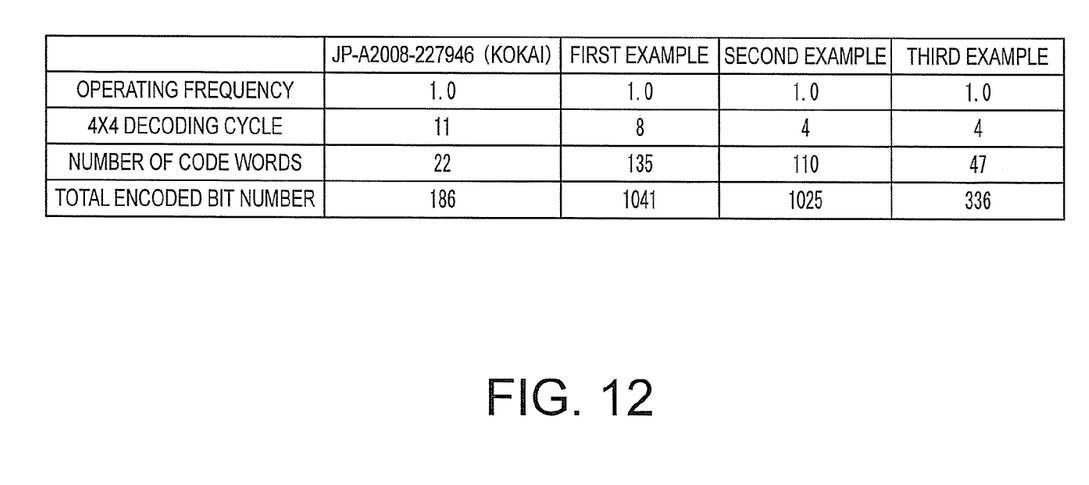
FIG. 12 is a view for comparing the performance of a decoding process between the case where the composite table of FIG. 10 is used and the case where the composite table of FIG. 5, the composite table of FIG. 8 or a known table is used.

FIG. 12 is a view for comparing the performance of a decoding process of the case where the composite table of the third example is used with that of the case where the composite table of the first example, the composite table of the second example or a known table is used. In the composite table of the third example, the number of codes and the total number of code bits are reduced much more than the second example, thus further reducing formation area on a semiconductor device being allowable.

As described above, like the composite table of the second example, the composite table of the third example allows simultaneous decoding of maximum four variable-length codes. In addition, in the composite table of the third example, if the total number of nonzeros and zeros is less than eight, that is, if these nonzeros and zeros occupy half or more of one block for two clock cycles, the corresponding variable-length code is not included in the composite table. Accordingly, the reduction of the number of entries is significant in the composite table of the third example, compared to the composite table of the second example. Therefore, the occupation area of the composite table on a semiconductor device is reduced to achieve desired compactness.

Explained in the example above is processing of a 4×4 element block within four clock cycles. Not only that, the processing for different clock cycles is also possible. For example, processing of a 4×4 element block for two clock cycles is achieved with a composite table in which run is increased by eight or more for one clock cycle.

FOURTH EXAMPLE OF COMPOSITE TABLE

Figure 13:
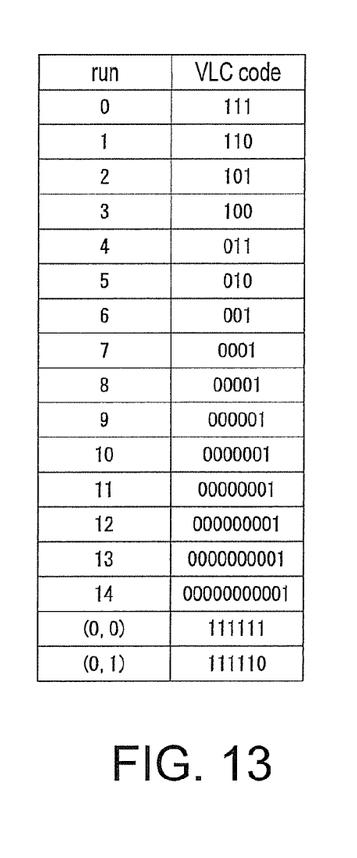
FIG. 13 is a view showing a composite table according to a fourth example.

Explained above for the composite table of the second and third examples is that four variable-length codes are decoded for one clock cycle. In contrast, a composite table of a fourth example which will be described below allows decoding of two variable-length codes for one clock cycle. In the composite table of the fourth example, it is possible to further reduce code amount without deteriorating the processing performance.

FIG. 13 is a view showing a composite table according to a fourth example. The composite table of FIG. 13 includes the first table and a second table having only two entries.

The requirements for forming the composite table according to the fourth example are as follows.

1: The total of runs (the total number of zeros) does not exceed 16.

2': The total number of nonzeros and zeros corresponding to a combination of variable-length codes is up to maximum two.

3': The total number of nonzeros and zeros is smaller than four.

The requirements 2' and 3' are a stricter version of the requirements 2 and 3, respectively. Under the requirements 1, 2' and 3', registered in the composite table of the fourth example are only two types of run (0, 0) and (0, 1) corresponding to two types of variable-length codes.

Figure 14:
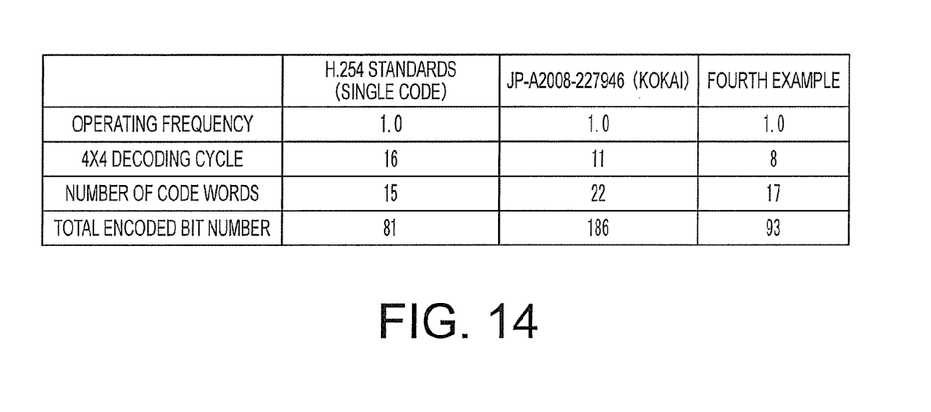
FIG. 14 is a view for comparing the performance of a decoding process between the case where the composite table of FIG. 13 is used and the case where the composite table of FIG. 10 or a known table is used.

FIG. 14 is a view for comparing the performance of a decoding process between the case where the composite table of the fourth example is used and the case where a known table is used. In the composite table of the fourth example, the first table is added with the second table only for mere two variable-length codes. However, it is understood form FIG. 14 that the composite table of the fourth example exhibits decoding performance twice high as a table for a single code according to H.264 standards.

As described above, the composite table of the fourth example is characteristic in that it exhibits significantly enhanced decoding performance with minimum changes to the composite table, thus excellent in practical use.

At least part of the decoding system 1 and the VLD apparatus 3 in the embodiment may be configured with hardware or software. When it is configured with software, a program that performs at least part of the functions of the decoding system 1 and the VLD apparatus 3 may be stored in a storage medium such as a flexible disk and CD-ROM, and then installed in a computer to run thereon. The storage medium may not be limited to a detachable one such as a magnetic disk and an optical disk but may be a standalone type such as a hard disk drive and a memory.

Explained in the embodiment is the example in which a decoding process is performed for each block of 4×4 elements. However, there is no limitation on the number of elements in one block. As the number of the elements changes, the contents of the requirements 1 to 3 change and also change the contents of entries in the composite tables of the first to fourth examples.

For example, in the case of performing a decoding process for each block of N×N (N being an integer of two or more) elements, the second table of the composite table registers combinations of nonzeros and zeros at the range that the total number of the nonzeros and zeros does not exceed N×N. This is a general form of the requirement 1.

The composite tables according to the first and fourth examples are provided for maximum two variable-length codes. In contrast, the composite tables according to the second and third examples are provided for maximum four variable-length codes. The composite table can be freely adjusted for any maximum number of variable-length codes. The feature of the present embodiment lies in the composite table provided for the combination of k (k being an integer of two or more) types of variable-length codes. Moreover, in a general form, the requirement 3 indicates that the combination for which the total number of nonzeros and zeros corresponding to a variable-length code exceeds a specific threshold value is excluded from combinations of maximum k (k being an integer of two or more) types of variable-length codes.

Moreover, a program that achieves the function of at least part of the decoding system 1 and the VLD apparatus 3 may be distributed via a communication network (including wireless communication) such as the Internet. The program may also be distributed via an online network such as the Internet or a wireless network, or stored in a storage medium and distributed under the condition that the program is encrypted, modulated or compressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A variable-length code decoding apparatus for decoding an input bitstream composed of a plurality of variable-length codes into decoded data composed of nonzeros and zero information expressing a number of successive zeros of 0 or more piece, comprising:
    a first-table storing part configured to store a first table that associates each of the variable-length codes with zero information of a corresponding decoded data;
    a second-table storing part configured to store a second table that associates combinations of a plurality of types of variable-length codes with combinations of zero information of a plurality of types of decoded data;
    a priority determining part configured, if variable-length codes included in the input bitstream and a combination of the variable-length codes are stored in both of the first and second tables, to read out by priority a combination of zero information that is stored in the second table and corresponds a combination of variable-length codes having the largest number of codes, whereas if variable-length codes included in the input bitstream is not stored in the second table but stored in the first table, to read out zero information that is stored in the first table and corresponds to the variable-length codes; and
    a decoding part configured to generate the decoded data based on the zero information or the combination of zero information read out by the priority determining part, for each group of a plurality of types of variable-length codes included in the input bitstream.

2. The apparatus of claim 1, wherein the decoding part generates the decoded data for each block of a specific number of elements comprising nonzeros or zeros stored in a zigzag pattern, the nonzeros or zeros corresponding to the variable-length codes included in the input bitstream.

3. The apparatus of claim 2, wherein the second-table storing part stores the second table so that a total number of the nonzeros and the zeros does not exceed the specific number.

4. The apparatus of claim 3, wherein the second-table storing part stores the second table so that if a total number of zeros exceeds a first threshold value, another variable-length code is not further combined.

5. The apparatus of claim 2, wherein the decoding part generates the decoded data for one block at clock cycles equal to or less than a half of a total number of elements in the block.

6. The apparatus of claim 1, wherein the second-table storing part stores the second table that includes combinations of maximum k types of the variable-length codes, where k is an integer of two or more.

7. The apparatus of claim 6, wherein the second-table storing part stores the second table obtained by excluding the combinations that the total number of nonzeros and zeros exceeds a second threshold value, among the combinations of maximum k types of the variable-length codes.

8. The apparatus of claim 1, wherein the input bitstream includes a nonzero corresponding to each of the variable-length codes, wherein the apparatus further comprises a temporary storage part configured to, when the priority determining part reads out by priority the combination of zero information that is stored in the second table and corresponds to the combination of variable-length codes, temporarily store a nonzero corresponding to the combination of zero information among the nonzeros, and the decoding part generates the decoded data based on the zero information read out from the second table by the priority determining part and the nonzero temporarily stored in the temporary storage part.

9. A decoding system comprising:

a variable-length code decoding apparatus configured to generate decoded data composed of nonzeros and zeros, the number of the zeros being 0 or more pieces, by performing variable-length code decoding to an input bitstream having variable-length codes made by motion compensation, discrete cosine transform, and quantization;

an inverse quantization apparatus configured to perform inverse quantization to the decoded data;

an inverse discrete cosine transforming apparatus configured to perform inverse discrete cosine transform to the inverse-quantized data; and a motion compensating apparatus configured to perform motion compensation to the data after the inverse discrete cosine transform, wherein the variable-length code decoding apparatus includes:

a first-table storing part configured to store a first table that associates each of the variable-length codes with zero information expressing a number of zero of a corresponding decoded data;

a second-table storing part configured to store a second table that associates combinations of a plurality of types of variable-length codes with combinations of zero information of a plurality of types of decoded data that correspond to the types of variable-length codes, respectively;

a priority determining part configured, if variable-length codes included in the input bitstream and a combination of the variable-length codes are stored in both of the first and second tables, to read out by priority a combination of zero information that is stored in the second table and corresponds to a combination of variable-length codes having the largest number of codes, whereas if variable-length codes included in the input bitstream is not stored in the second table but stored in the first table, to read out zero information that is stored in the first table and corresponds to the variable-length codes; and a decoding part configured to generate the decoded data based on the zero information or the combination of zero information read out by the priority determining part, for each group of a plurality of types of variable-length codes included in the input bitstream.

10. The system of claim 9, wherein the decoding part generates the decoded data for each block of a specific number of elements comprising nonzeros or zeros stored in a zigzag pattern, the nonzeros or zeros corresponding to the variable-length codes included in the input bitstream.

11. The system of claim 10, wherein the second-table storing part stores the second table so that a total number of the nonzeros and the zeros does not exceed the specific number.

12. The system of claim 11, wherein the second-table storing part stores the second table so that if a total number of zeros exceeds a first threshold value, another variable-length code is not further combined.

13. The system of claim 10, wherein the decoding part generates the decoded data for one block at clock cycles equal to or less than a half of a total number of elements in the block.

14. The system of claim 9, wherein the second-table storing part stores the second table that includes combinations of maximum k types of the variable-length codes, where k is an integer of two or more.

15. The system of claim 14, wherein the second-table storing part stores the second table obtained by excluding the combinations that the total number of nonzeros and zeros exceeds a second threshold value, among the combinations of maximum k types of the variable-length codes.

16. The system of claim 9, wherein the input bitstream includes a nonzero corresponding to each of the variable-length codes, wherein the system further comprises a temporary storage part configured to, when the priority determining part reads out by priority the combination of zero information that is stored in the second table and corresponds to the combination of variable-length codes, temporarily store a nonzero corresponding to the combination of zero information among the nonzeros, and the decoding part generates the decoded data based on the zero information read out from the second table by the priority determining part and the nonzero temporarily stored in the temporary storage part.

17. A variable-length code decoding method for decoding an input bitstream composed of a plurality of variable-length codes into decoded data composed of nonzeros and zeros information expressing a number of successive zeros of 0 or more piece, comprising:

storing a first table that associates each of the variable-length codes with zero information of a corresponding decoded data;

storing a second table that associates combinations of a plurality of types of variable-length codes with combinations of zero information of a plurality of types of decoded data;

if variable-length codes included in the input bitstream and a combination of the variable-length codes are stored in both of the first and second tables, reading out by priority a combination of zero information that is stored in the second table and corresponds to a combination of variable-length codes having the largest number of codes, whereas if variable-length codes included in the input bitstream is not stored in the second table but stored in the first table, reading out zero information that is stored in the first table and corresponds to the variable-length codes; and generating the decoded data based on the zero information or the combination of zero information read out by the priority determining part, for each group of a plurality of types of variable-length codes included in the input bitstream.

18. The method of claim 17, wherein the second table stores combinations of the plurality of types of variable-length codes so that a total number of the nonzeros and the zeros does not exceed a specific number.

19. The method of claim 18, wherein the second table stores the combinations of the variable-length codes so that if the total number of zeros exceeds a first threshold value, another variable-length code is not further combined.

20. The method of claim 18, wherein the second table stores combinations that the total number of nonzeros and zeros exceeds a second threshold value, among the combinations of maximum k types of the variable-length codes, where k is an integer of two or more.

* * * * *